United States Patent
Zhang et al.

(10) Patent No.: US 8,459,530 B2
(45) Date of Patent: Jun. 11, 2013

(54) AUTOMATIC WIRE FEEDING METHOD FOR WIRE BONDERS

(75) Inventors: Yue Zhang, Singapore (SG); Keng Yew James Song, Singapore (SG); Xiao Liang Chen, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 565 days.

(21) Appl. No.: 12/608,279

(22) Filed: Oct. 29, 2009

(65) Prior Publication Data
US 2011/0101073 A1   May 5, 2011

(51) Int. Cl.
*B23K 31/00* (2006.01)
(52) U.S. Cl.
USPC .................................................. 228/180.5
(58) Field of Classification Search
USPC ........................................ 228/4.5, 180.5, 904
See application file for complete search history.

(56) References Cited

U.S. PATENT DOCUMENTS

| | | | | |
|---|---|---|---|---|
| 4,172,544 A * | 10/1979 | Pennings et al. | ............. | 226/97.4 |
| 4,928,871 A * | 5/1990 | Farassat | ..................... | 228/180.5 |
| 5,402,927 A * | 4/1995 | Frasch | ..................... | 228/180.5 |
| 5,685,476 A * | 11/1997 | Miyoshi | ..................... | 228/180.5 |
| 5,981,371 A * | 11/1999 | Yamazaki et al. | ............ | 438/617 |
| 6,098,868 A * | 8/2000 | Mae et al. | ..................... | 228/102 |
| 6,270,000 B1 * | 8/2001 | Nishiura | ..................... | 228/180.5 |
| 6,273,321 B1 * | 8/2001 | Koduri | ......................... | 228/102 |
| 6,581,283 B2 * | 6/2003 | Sugiura et al. | .................. | 29/843 |
| 6,619,530 B2 * | 9/2003 | Ushiki et al. | .................. | 228/4.5 |
| 6,789,721 B2 * | 9/2004 | Stilwell et al. | ............. | 228/110.1 |
| 2008/0272178 A1 * | 11/2008 | Kwan et al. | ..................... | 228/45 |
| 2009/0091006 A1 * | 4/2009 | Pirkle et al. | ..................... | 257/666 |

* cited by examiner

*Primary Examiner* — Kiley Stoner
*Assistant Examiner* — Carlos Gamino
(74) *Attorney, Agent, or Firm* — Ostrolenk Faber LLP

(57) ABSTRACT

Wire is fed to a bonding tool of a wire bonder by a pneumatic device that is operative to urge the wire to feed through an outlet of the pneumatic device towards the bonding tool. A wire clamp is located adjacent to the outlet of the pneumatic device and a wire guider with a hole is located adjacent to the wire clamp between the wire clamp and the bonding tool for threading the wire through the hole before being fed to the bonding tool.

6 Claims, 5 Drawing Sheets

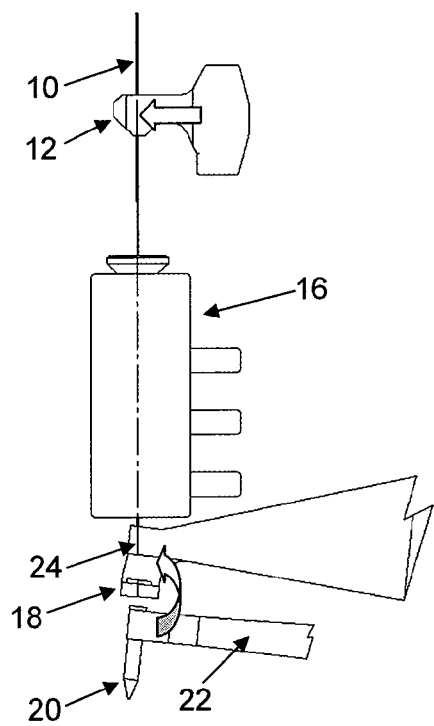
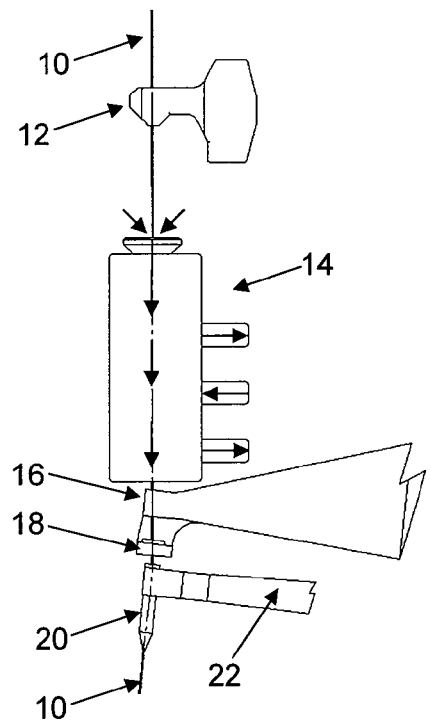
FIG. 4(a)     FIG. 4(b)

AUTOMATIC WIRE FEEDING METHOD FOR WIRE BONDERS

FIELD OF THE INVENTION

The invention relates to wire bonders, and in particular to wire-feeding systems for wire bonders.

BACKGROUND AND PRIOR ART

Automatic wire bonders are used during semiconductor assembly and packaging for making electrical wire connections between electrical contact pads on a die and a substrate, or between electrical contact pads on different dice. Wire is fed from a wire spool containing bonding wire, typically gold or copper wire, to a bonding tool such as a capillary for performing wire bonding at the bonding tool.

Along the feeding route of the wire between the wire spool and the capillary, the wire passes through various devices, which may include a pneumatic device and a wire clamp for controlling feeding of the wire during wire bonding. FIG. 1 is a side view of a wire feeding route of a conventional wire bonder. Bonding wire 100, for instance gold or copper wire, is fed from a wire spool (not shown) into a pneumatic device 102 which is operative to apply vertical vacuum suction forces upwards or downwards to urge movement of the bonding wire 100 in these directions. A wire guider 104 is located some distance away from the pneumatic device 102 and it has a small hole for threading and guiding the bonding wire 100 along the feeding route. A wire clamp 106 is located below the wire guider 104 to clamp onto the bonding wire 100 when movement of the bonding wire 100 is to be restrained. The bonding wire 100 is then passed through a capillary 108 located at one end of a transducer horn 110. Wire bonding is conducted at a bottom tip of the capillary 108.

A shortcoming of such a conventional wire bonder design is that wire threading has to be conducted manually when the bonding wire is being set up for wire bonding. Due to the small dimensions of the bonding wire and devices it has to be threaded through, a skilled technician is required to perform manual wire threading, and even then, the process itself is a time-consuming one.

Moreover, broken wire may occur during wire bonding due to various reasons, such as short tail arising from premature termination of a tail bond, missing ball leading to incorrect formation of a ball bond, and other reasons. Each time there is a broken wire, the wire bonder needs to be stopped and the bonding wire has to be rethreaded manually again, thereby incurring unnecessarily long downtimes and incurring penalties in terms of productivity.

SUMMARY OF THE INVENTION

It is thus an object of the invention to seek to provide a system and method for automatically threading the wire of a wire bonder, such as in cases of broken wire, in order to help to free valuable skilled labour for other tasks, and to reduce machine downtime.

According to a first aspect of the invention, there is provided a method for feeding wire to a bonding tool of a wire bonder, comprising the steps of: locating the wire in a pneumatic device; urging the wire with the pneumatic device to feed through a clamping point of a wire clamp located adjacent to the pneumatic device and a hole of a wire guider located adjacent to the wire clamp between the wire clamp and the bonding tool; and urging the wire with the pneumatic device to feed through the bonding tool.

According to a second aspect of the invention, there is provided a method for feeding wire to a bonding tool of a wire bonder when a broken wire is detected during wire bonding and the wire is separated from the bonding tool, comprising the steps of: clamping the wire with a wire clamp while the wire is located in a pneumatic device; feeding a length of wire from a wire source towards the pneumatic device; opening the wire clamp to unclamp the wire; urging the wire with the pneumatic device to feed through a hole of a wire guider which is located adjacent to the bonding tool between the pneumatic device and the bonding tool; and urging the wire with the pneumatic device to feed through the bonding tool.

According to a third aspect of the invention, there is provided an apparatus for feeding wire to a bonding tool of a wire bonder, comprising: a pneumatic device that is operative to urge the wire to feed through an outlet of the pneumatic device towards the bonding tool; a wire clamp located adjacent to the outlet of the pneumatic device; and a wire guider with a hole which is located adjacent to the wire clamp between the wire clamp and the bonding tool for threading the wire through the hole before being fed to the bonding tool.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of preferred embodiments of a system and method in accordance with the invention will now be described with reference to the accompanying drawings, in which:

FIG. 4 is an illustration of an automatic wire feeding process during wire bonding according to the preferred embodiment of the invention.

DETAILED DESCRIPTION OF THE PREFERRED EMBODIMENTS OF THE INVENTION

Figure 1:
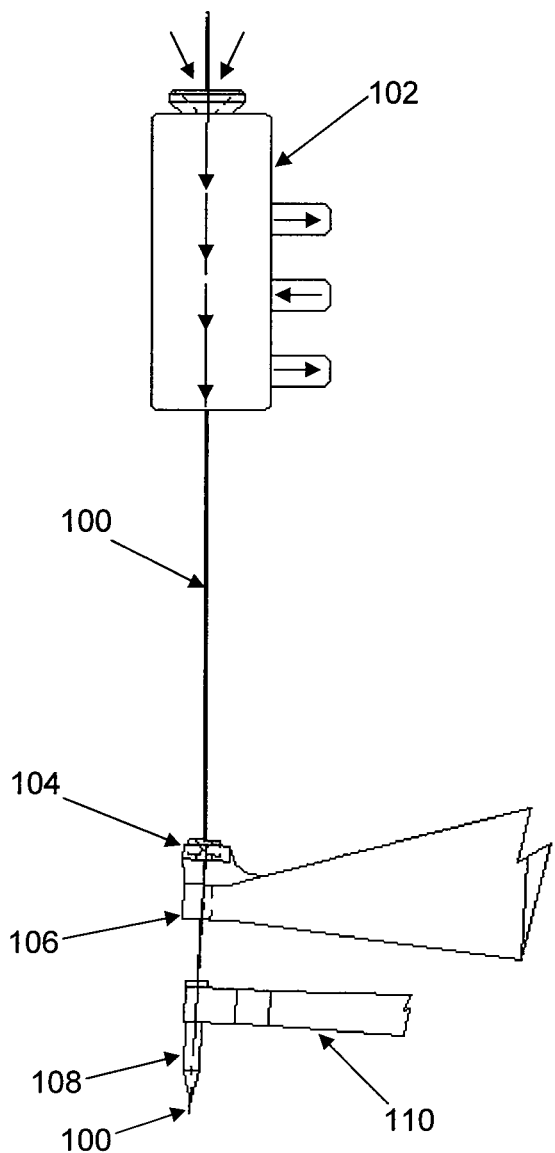
FIG. 1 is a side view of a wire feeding route of a conventional wire bonder.
Figure 2:
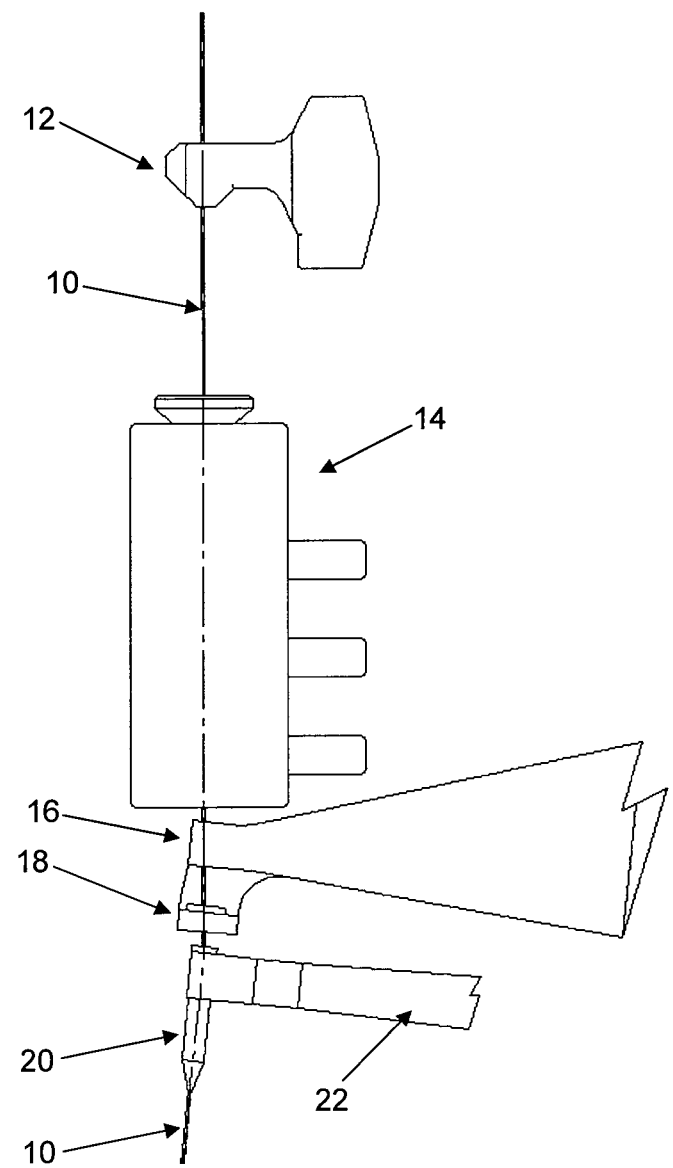
FIG. 2 is a side view of a wire feeding route of a wire bonder according to a first preferred embodiment of the invention.

FIG. 2 is a side view of a wire feeding route of a wire bonder according to a first preferred embodiment of the invention. An upper wire clamp 12 is located between a wire source such as a wire spool (not shown) and a pneumatic device 14 along the wire feeding route of a length of bonding wire 10. The bonding wire 10, such as gold or copper wire, is supplied from the wire spool and fed into the pneumatic device 14. The pneumatic device 14 is operative to apply vertical forces to urge the bonding wire 10 to move upwards to pull the bonding wire 10, or downwards to feed the bonding wire 10 through an outlet of the pneumatic device 14 towards a bonding tool.

Immediately below the pneumatic device 14 and located adjacent to the outlet of the pneumatic device 14 is a lower wire clamp 16 located along the wire feeding route. The lower wire clamp 16 is operable to clamp onto the bonding wire 10 at a clamping point to restrain its movement during wire bonding. When the pneumatic device 14 is activated, a vacuum suction force is applied on the bonding wire 10 to urge and feed it through the clamping point of the lower wire clamp 16 in a direction towards the bonding tool.

The lower wire clamp 16 should be as close to the pneumatic device 14 as possible. The larger the distance, the greater the risk of bonding wire 10 being fed outside the confines of the lower wire clamp 16, which may then lead to wire bend and failed wire threading. Thus, where the lower wire clamp 16 is rotatable between an upper position and a lower position, then at the upper position of the lower wire clamp 16 when it is swung upwards, the distance between the outlet of the pneumatic device 14 and the lower wire clamp 16 should preferably be between 0.5 mm and 10 mm.

The wire guider 18 is located adjacent to the lower wire clamp 16 between the lower wire clamp 16 and the bonding tool. The wire guider 18 may be mounted onto a base of the lower wire clamp 16 and has a small hole for threading and guiding the bonding wire 10 through the hole along the wire feeding route to the bonding tool. The bonding wire 10 is then fed to the bonding tool, such as a capillary 20 located at one end of a transducer horn 22. The transducer horn 22 may be part of an ultrasonic transducer. Bonding wire 10 protruding from a lower tip of the capillary 20 is used to perform wire bonding at the tip of the capillary 20.

Furthermore, with the assistance of an upper wire clamp 12, bonding wire 10 may also be fed towards the capillary 20 by swinging up the transducer horn 22 together with the capillary 20 towards the wire guider 18 while restraining movement of the bonding wire 10 by clamping the bonding wire 10 with the upper wire clamp 12. This action forces bonding wire 10 to be fed to the capillary 20 and is an alternative to providing a pneumatic downwards force at the pneumatic device 14. Another advantage of this feeding action of swinging up the transducer horn 22 and capillary 20 is that, by ensuring adequate feeding of bonding wire to the tip of the capillary 20, it helps to eliminate or reduce the risk of short tail or missing ball occurring.

Figure 3:
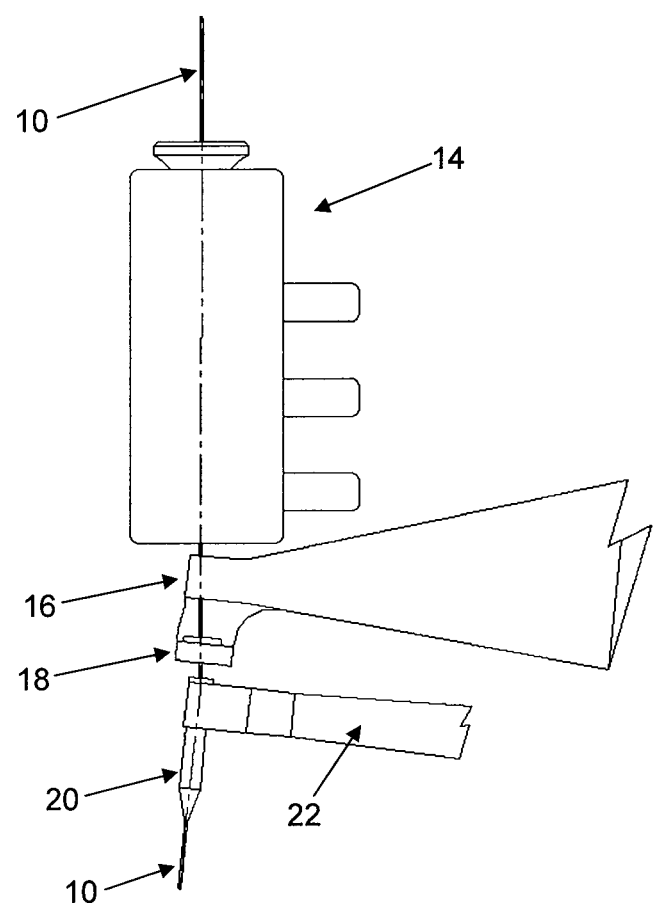
FIG. 3 is a side view of a wire feeding route of a wire bonder according to a second preferred embodiment of the invention.

FIG. 3 is a side view of a wire feeding route of a wire bonder according to a second preferred embodiment of the invention. The second preferred embodiment is similar to the first preferred embodiment, except that there is no upper wire clamp 12. Therefore, the second preferred embodiment not including the upper wire clamp 12 will not be discussed in further detail.

For feeding of bonding wire 10 prior to commencing wire bonding, bonding wire 10 is first manually inserted into the pneumatic device 14 by an operator to locate the bonding wire 10 in the pneumatic device 14. Thereafter, the pneumatic device 14 is activated to apply a downwards vacuum suction force onto the bonding wire 10. The downwards vacuum suction force will automatically push the bonding wire 10 through the lower wire clamp 16, wire guider 18 and capillary 20 until the bonding wire 10 protrudes through the tip of the capillary 20. The wire bonder is now ready to perform wire bonding.

FIG. 4 is an illustration of an automatic wire feeding process during wire bonding according to the preferred embodiment of the invention. In FIG. 4(*a*), a broken wire 24 is encountered during wire bonding. A spring force in the bonding wire 10 causes the broken wire 24 to recoil and to be separated from the capillary 20. Thus, once the bonding system detects a broken wire during wire bonding, the upper wire clamp 12 is immediately closed to clamp the bonding wire 10 while the bonding wire 10 is located in the pneumatic device 14 so as to prevent any further retraction of the bonding wire 10. The lower wire clamp 16 should also be closed for this purpose. If there is no upper wire clamp 12 as in the second preferred embodiment, then only the lower wire clamp 16 will close onto the bonding wire 10 to restrain its movement.

In FIG. 4(*b*), a downwards vacuum suction force is automatically activated in the pneumatic device 14 onto the bonding wire 10 in order to urge the bonding wire 10 downwards into the wire guider 18 towards the capillary 20. At the same time, the upper and lower wire clamps 12, 16 are opened to unclamp the bonding wire 10 to feed a length of the bonding wire 10 from the wire spool towards the pneumatic device 14 for feeding bonding wire 10 to the capillary 20. Also, prior to opening the upper and lower wire clamps 12, 16, the wire spool should feed a certain length of bonding wire 10 to the pneumatic device 14 as a buffer to prevent the bonding wire 10 from recoiling and flying away from the pneumatic device 14 due to tension in the bonding wire 10. With the proper application of this downwards force by the pneumatic device 14, the bonding wire 10 is fed through the hole of the wire guider 18 and the capillary 20 before protruding from the tip of the capillary 20 so that wire bonding may continue without any operator intervention in respect of the broken wire.

Figure 5:
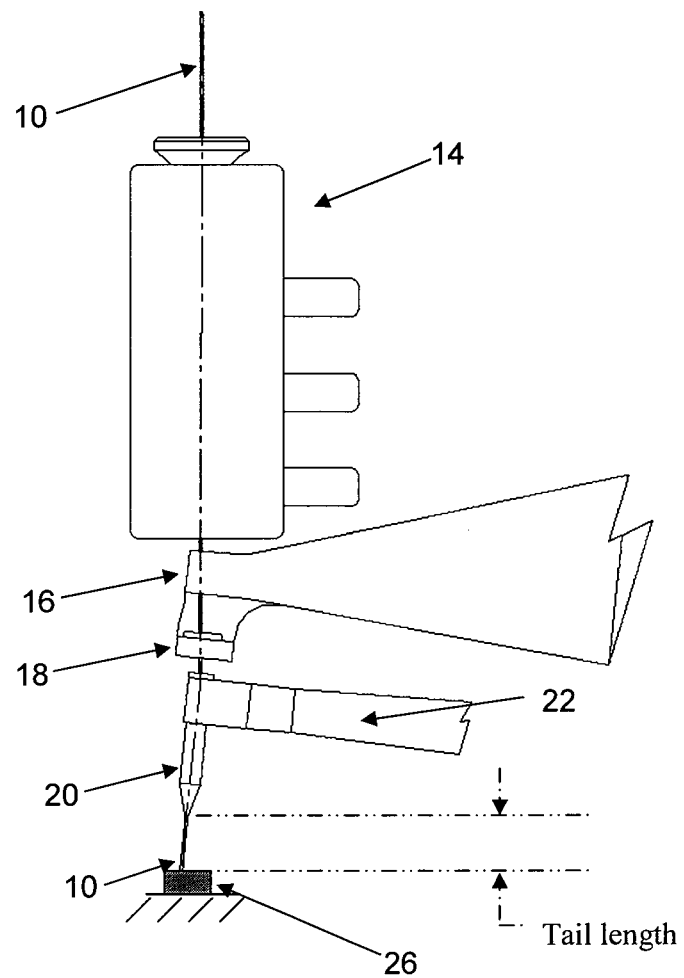
FIG. 5 illustrates how a desired tail length of the bonding wire may be automatically obtained.

FIG. 5 illustrates how a desired tail length of the bonding wire may be automatically obtained. The bonding tool 20 is first positioned above a conductive surface 26, such as a lead frame, a printed copper pad on a printed circuit board or a window clamp which clamps onto a material to be bonded during wire bonding. The distance from the lower tip of the bonding tool 20 to the conductive surface 26 is set at a desired tail length of the bonding wire 10. As the bonding wire 10 is urged to feed through the bonding tool 20, the lower wire clamp 16 rapidly opens and closes to control the feeding rate of the bonding wire 10.

Meanwhile, bond stick detection is continuously performed at short intervals to determine the exact point in time when the bonding wire 10 contacts the conductive surface 26. Bond stick detection is a typical feature in bonding machines and refers to a process during wire bonding wherein the bonding apparatus checks whether an electrical current is passing through the bonding wire 10. If so, this indicates a closed electrical circuit formed by the bonding wire 10. When a closed electrical circuit is detected indicating contact between the bonding wire 10 and the conductive surface 26, further feeding of bonding wire 10 to the bonding tool 20 is stopped so that the correct tail length is automatically obtained.

It should be appreciated that the automatic wire feeding systems according to the preferred embodiments of the invention reduce manual intervention for threading bonding wire in a wire bonding system. This frees up skilled labour to perform other tasks and also improves productivity by shortening the time required for threading bonding wire. Moreover, with the assistance of a upper wire clamp 12 above the pneumatic device 14, a wire bonding process can be speeded up by reducing delay for making a second bond through more reliable feeding of bonding wire 10 to the capillary 20.

The invention described herein is susceptible to variations, modifications and/or additions other than those specifically described and it is to be understood that the invention includes all such variations, modifications and/or additions which fall within the spirit and scope of the above description.

The invention claimed is:

1. Method of threading an end of a wire through a bonding tool of a wire bonder before the wire bonder performs wire bonding, the method comprising the steps of:

locating the end of the wire in a pneumatic device; and applying a force produced from the pneumatic device to thread the end of the wire successively through:

the pneumatic device, a clamping point of a first wire clamp located adjacent to the pneumatic device, a hole of a wire guider located adjacent to the first wire clamp, and the bonding tool located adjacent to the wire guider, wherein the method further comprises the step of feeding the wire to the bonding tool by swinging the bonding tool in a direction towards the wire guider while clamping the wire with a second wire clamp.

2. Method as claimed in claim 1, wherein the wire guider is mounted onto a base of the first wire clamp.

3. Method as claimed in claim 1, further comprising a prior step of manually inserting the wire into the pneumatic device in order to locate the wire in the pneumatic device.

4. Method as claimed in claim 1, wherein the second wire clamp is an upper wire clamp located between a wire source and the pneumatic device.

5. Method as claimed in claim 1, further comprising the step of positioning the bonding tool above a conductive surface such that a distance between the bonding tool and the conductive surface is equal to a desired tail length, and stopping the feeding of wire to the bonding tool when contact between the wire and the conductive surface is detected in order to obtain the desired tail length automatically.

6. Method of threading an end of a wire through a bonding tool of a wire bonder before the wire bonder performs wire bonding, the method comprising the steps of:

locating the end of the wire in a pneumatic device; and applying a force produced from the pneumatic device to thread the end of the wire successively through:

the pneumatic device, a clamping point of a first wire clamp, the first wire clamp being immediately below the pneumatic device and the clamping point being located adjacent to an outlet of the pneumatic device, a hole of a wire guider located adjacent to the first wire clamp, and the bonding tool located adjacent to the wire guider, wherein the method further comprises the step of feeding the wire to the bonding tool by swinging the bonding tool in a direction towards the wire guider while clamping the wire with a second wire clamp.

\* \* \* \* \*